United States Patent [19]

Payne et al.

[11] 4,321,561
[45] Mar. 23, 1982

[54] SWITCH OPERATED CAPACITIVE OSCILLATOR APPARATUS

[75] Inventors: Robert L. Payne, Crystal; Thomas R. Reinke, Robbinsdale, both of Minn.

[73] Assignee: Honeywell Inc., Minneapolis, Minn.

[21] Appl. No.: 79,907

[22] Filed: Sep. 28, 1979

[51] Int. Cl.³ ............................................. H03K 3/353
[52] U.S. Cl. .................................. 331/111; 331/108 D
[58] Field of Search .......... 331/108 A, 108 C, 108 D, 331/111, 143

[56] References Cited

U.S. PATENT DOCUMENTS

| | | | |
|---|---|---|---|
| 3,904,988 | 9/1975 | Hsiao | 331/108 C X |
| 3,995,232 | 11/1976 | Laugesen | 331/108 D X |
| 4,001,721 | 1/1977 | Fukuda | 331/111 |
| 4,001,722 | 1/1977 | Patel et al. | 331/111 |
| 4,015,216 | 3/1977 | Masuda | 331/108 D X |
| 4,040,728 | 8/1977 | Seidel | 331/108 C X |
| 4,072,910 | 2/1978 | Dingwall et al. | 331/108 C X |
| 4,083,020 | 4/1978 | Goldberg | 331/108 C X |
| 4,115,748 | 9/1978 | Kubo et al. | 331/111 |
| 4,146,849 | 3/1979 | Satou | 331 111/ |
| 4,205,279 | 5/1980 | Beutler | 331/108 D X |
| 4,263,567 | 4/1981 | Astle | 331/111 |

OTHER PUBLICATIONS

CMOS Databook, National Semiconductor Corp., 1977, pp. 5-20 through 5-23.

Primary Examiner—Michael J. Tokar
Assistant Examiner—Edward P. Westin
Attorney, Agent, or Firm—Theodore F. Neils

[57] ABSTRACT

An oscillator circuit is disclosed using a capacitive voltage divider, the circuit being integratable in a monolithic integrated circuit chip. Currents are switched into and out of that one of the capacitors in the divider which is connected through inverters to the other capacitor in a feedback loop. Switching of the currents is controlled in another feedback loop involving a further inverter.

14 Claims, 2 Drawing Figures

SWITCH OPERATED CAPACITIVE OSCILLATOR APPARATUS

BACKGROUND OF THE INVENTION

The present invention relates to electronic oscillator circuits, and more particularly to complementary metal-oxide-semiconductor field-effect transistor oscillator circuits.

Many known complementary metal-oxide-semiconductor (CMOS) field-effect transistor oscillator circuits operate with voltage peaks occurring at internal nodes of the circuit that are beyond the voltage range taken by the circuit voltage supply. Such operating characteristics cause difficulties when these oscillator circuits are implemented in monolithic integrated circuit form. The first of these difficulties relates to the stability of the oscillation cycle, i.e. the duration of the oscillation period. When internal voltage values in the oscillation circuit exceed the power supply voltage value or go below the ground reference voltage, the pn semiconductor junctions surrounding the source and drain regions in the substrate of the p-channel and n-channel transistors, respectively, will be driven into being forward-biased. Because of this occurrence, and because of the well-known strong temperature dependence of such forward-biased junctions, the oscillation period will become quite temperature dependent because this period is altered by the changing switching characteristics of these pn semiconductor junctions. Also, the oscillation period duration will depend additionally on the variations occurring in the power supply voltage.

Another problem resulting when such internal circuit voltages occur outside the range taken by the circuit voltage supply is the problem of "latch-up." That is, various parasitic bipolar devices, such as transistors and silicon controlled rectifiers, are always present and can be activated by such voltage excursions. Particularly, silicon controlled rectifier action can occur along the surface of a CMOS monolithic integrated circuit chip causing the surface regions to go into a "latch-up" state preventing normal operation of the transistors.

Thus, a desirable CMOS oscillator will not have internal voltage range excursions which go beyond the range of the circuit voltage supply.

SUMMARY OF THE INVENTION

The invention provides an electronic oscillator circuit in which a switchable current control means supplies current to and draws current from a first capacitance, this first capacitance also being supplied current from a plural output state threshold switch having its input connected to this capacitance and its output connected through a second capacitance to also this first capacitance. The threshold switch is in a higher output voltage state only when the voltage occurring across the first capacitance exceeds a selected threshold provided in the threshold switch. The output of the threshold switch also controls whether the switchable current control means supplies current to or draws current from the first capacitance.

The switchable current control means and the threshold switch are conveniently implemented using complementary metal-oxide-semiconductor field-effect transistors. The capacitances can be implemented by compatible structures when the entire circuit is formed in a monolithic integrated circuit chip. The oscillation circuit frequency and the general waveform within the cycle can be externally controlled to a considerable degree through control of the current supplied to and drawn from the first capacitance by the switchable current control means.

The threshold switch can be implemented with a cascade of two CMOS inverters and possibly a third inverter in parallel with the last cascaded inverter. The last cascaded inverter output is electrically connected to the second capacitance means. In the three inverter arrangement, to further stabilize the oscillation cycle, an additional metal-oxide-semiconductor field-effect transistor can be provided in series with the CMOS transistor pair provided in the last cascaded inverter.

DESCRIPTION OF THE PREFERRED EMBODIMENTS

Figure 1:
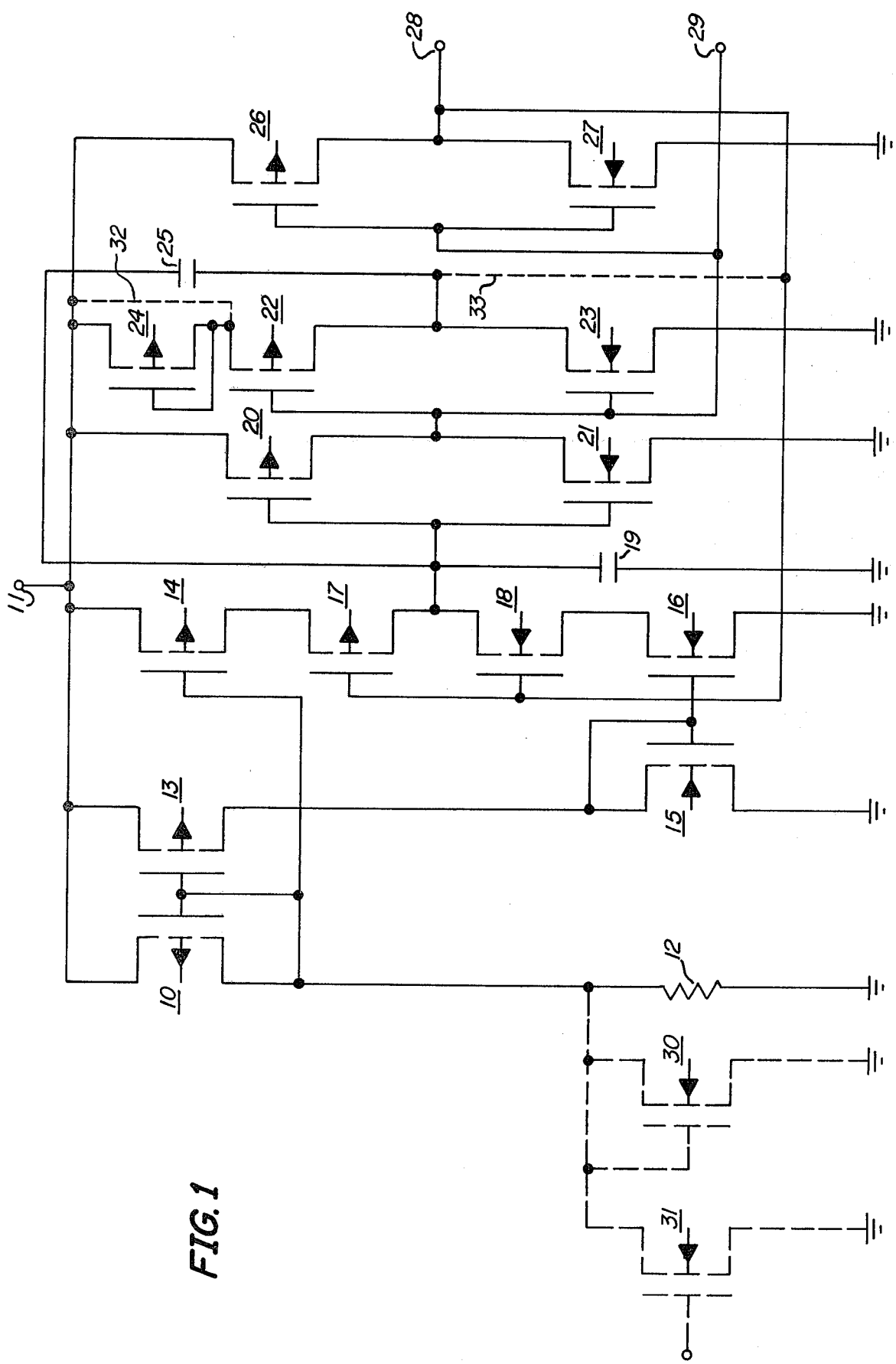
FIG. 1 shows a schematic diagram of the circuit of the present invention.

Shown in FIG. 1 is an electronic oscillation circuit using complementary metal-oxide-semiconductor (CMOS) field-effect transistor technology, a circuit which can have certain component parameters therein selected such that the internal voltages occurring in the circuit during operation do not reach values outside the range of voltage taken by the circuit voltage supply. The circuit shown in FIG. 1 can be fabricated in a monolithic integrated circuit by relying on any suitable fabrication process used for fabricating CMOS chips several of which are well known.

Specifically an n-type conductivity substrate is usually used in which each enhancement mode, p-channel metal-oxide-semiconductor field-effect transistor (MOSFET) is formed directly. Each enhancement mode, n-channel MOSFET is formed in a p-conductivity type region, often called a well or tub, which is formed in this n-type conductivity substrate. In such an arrangement, all of the substrate connections of the p-channel MOSFETs are made to the n-type conductivity substrate and this substrate is connected to the most positive supply voltage in the circuit. All of the n-channel MOSFETs substrate connections are made to the p-type conductivity wells which are, typically, all in turn electrically connected to the most negative supply voltage in the circuit. Such substrate connections are not explicitly shown in the circuit of FIG. 1 to minimize schematic diagram complexity.

The circuit shown in FIG. 1 has, on the left, a "current mirror" portion to provide a current source and current sink circuit which can be switched between these two functions, i.e. a switch controlled current source or sink circuit which can be directed to either source or sink current. The primary or control current is set by a p-channel MOSFET, 10, having its source connected to the interconnection point, 11, at which a positive supply voltage is to be provided. The drain of transistor 10 is connected to an impedance arrangement, the usual arrangement being shown as a resistor, 12. Resistor 12 has its other side connected to the most negative supply voltage in the circuit shown in FIG. 1 as ground. The gate of transistor 10 is connected to the drain thereof and a constant voltage is supplied across both resistor 12 and channel region of transistor 10, as accessed by its source and drain between interconnection point 11 and ground.

Therefore, the voltage drop across resistor 12 is approximately equal to the voltage supplied at point 11 less the threshold voltage of transistor 10 plus the transistor 10 gate-to-source voltage necessary to provide the current for this voltage drop across resistor 12. This voltage occurring across resistor 12 coupled with the resistance choice for resistor 12 determines the current passing through resistor 12 and so through the channel region and out the drain of transistor 10.

Two further p-channel MOSFETs, 13 and 14, also have the sources thereof connected to point 11 and the gates thereof connected to the gate of transistor 10. Thus, the same voltage occurring between the gate and source of transistor 10 must also occur between the gate and source of each of transistors 13 and 14. Since transistors 10, 13, and 14 are all fabricated simultaneously by the same process, they are well matched. Also, they are designed to have matching geometrical layouts. The result is that substantially the same current would flow through the channel regions and out of the drains of transistors 13 and 14 as flows through the channel region and out the drain of transistor 10.

The drain of transistor 13 is connected to the drain of an n-channel MOSFET, 15, so that the drain current of transistor 13 must flow into the drain and through the channel region of transistor 15, from drain to the source, the source of transistor 15 being connected to ground. Because this drain current of transistor 13 must also be carried by transistor 15 through its drain, the gate-to-source voltage of transistor 15 will adjust accordingly since the gate of this transistor is connected to the drain thereof. As a result, this very same gate-to-source voltage is supplied between the gate and source of another n-channel MOSFET, 16, which has its gate directly connected to the gate of transistor 15 while the source of transistor 16 is connected to ground. Thus, transistor 16 will draw or sink the same current at its drain as is supplied to the drain of transistor 15 as these two transistors are well matched, this being just that current flowing out of the drains of transistors 10 and 13.

Connected between the drains of transistors 14 and 16 are the channel regions, as accessed by the source and drain regions thereof, of two further MOSFET transistors, 17 and 18. Transistor 17 is a p-channel MOSFET and transistor 18 is an n-channel MOSFET. Transistors 17 and 18 are driven by a common signal applied to the gates thereof, that is the gates of transistors 17 and 18 are connected in common, so that when one of transistors 17 and 18 is switched on, the other is switched off. As a result, either current is supplied from transistor 14 serving as a current source through transistor 17 to the junction of the drains of transistors 17 and 18 where they are connected together, or current is drawn by transistor 16 serving as a current sink through transistor 18 from this same junction point.

Connected to this junction point is a first capacitance, 19, the other side of which is connected to ground. Hence, capacitance 19 can be charged by current flowing out of the drain of transistor 14 serving as a current source through current source switch transistor 17 or capacitance 19 can be discharged by the drain current drawn by transistor 16 serving as a current sink through current sink switch transistor 18.

The input of a CMOS inverter is connected to the ungrounded side of capacitance 19, i.e. to the junction point of transistors 17 and 18. This inverter comprises two MOSFETs, 20 and 21, the gates of which are connected in common with one another and serve as the input for the inverter. The output is taken at the common drains of p-channel MOSFET 20 and n-channel MOSFET 21 comprising the inverter. The source of transistor 20 is connected to point 11 while the source of transistor 21 is connected to ground.

If the voltage on capacitance 19, and so on the gates of transistors 20 and 21, is below the threshold of the inverter which is typically 40% to 60% of the voltage at point 11, the voltage at the inverter output, i.e. the drains of transistors 20 and 21, will be high. This is because transistor 20 will be switched on while transistor 21 will be switched off. And vice versa, if the voltage on capacitance 19 is high with respect to the inverter threshold, the output of the inverter at the drains of transistors 20 and 21 will be low with transistor 20 off and transistor 21 on.

The inverter comprising transistors 20 and 21 drives two further CMOS inverters in parallel cascaded after it, these further inverters operating similarly to the inverter based on transistors 20 and 21. The first of these further inverters comprises transistors 22 and 23. The n-channel MOSFET transistor 23 has its source grounded and its drain connected to the drain of p-channel MOSFET 22. The gates of both transistors 22 and 23 are connected to the output of the inverter comprising transistors 20 and 21, i.e. the common drain connection between transistors 20 and 21.

However, there is one change in the inverter comprising transistors 22 and 23 and that is the addition of a further transistor, 24. Transistor 24 is a p-channel MOSFET having both the drain thereof and the gate thereof connected to the source of transistor 22. The source of transistor 24 is connected to terminal 11. Thus, transistor 24 serves to reduce the voltage appearing across the series connected channel regions of transistors 22 and 23 by the amount of the threshold voltage of transistor 24 plus that voltage addition necessary to drive transistor 24 sufficiently to provide the current drawn through transistors 22 and 23.

The output of the inverter comprising transistors 22 and 23 is also at the common drain connection of these two transistors to which is also connected a capacitance, 25. The other plate of capacitance 25 is connected to the plate of capacitance 19 which is connected to the input of the inverter comprising transistors 20 and 21. Thus, capacitance 25 couples the output of the inverter comprising transistors 22 and 23 to the input of the inverter comprising transistors 20 and 21 and to capacitance 19. Operation of the inverter comprising transistors 22 and 23 occurs about a threshold just as operation does for the inverter comprising transistors 20 and 21. The threshold of the inverter involving transistors 22 and 23 is reduced somewhat by the presence of transistor 24.

The second inverter connected to the output of the inverter comprising transistors 20 and 21 is based on two further MOSFETs, 26 and 27. The source of p-channel transistor 26 is connected to point 11 while the source of n-channel transistor 27 is connected to ground. The output of the inverter is taken as the common drain connection of transistors 26 and 27 and is connected to the commonly joined gates of transistors 17 and 18. The input of the inverter comprising transistors 26 and 27, which is the common gate connection thereof, is, of course, connected to the output of the inverter comprising transistors 20 and 21, i.e. the common drain connection of transistors 20 and 21.

In operation there is an application of voltage between point 11 and ground typically in the range of 3.0 to 18.0 volts with the relatively positive voltage appearing at point 11. As indicated above, a current therefore flows out the drain of transistor 10 and through resistor 12. A current of equal magnitude flows out of the drain of transistor 13 and into the drain of transistor 15 as discussed above. Thus, a similar current flows either out of the drain of transistor 14 or into the drain of transistor 16 depending on which of transistors 17 and 18 is switched on and which is switched off.

Assuming that capacitances 19 and 25 are initially discharged, the inverter comprising transistors 20 and 21 will have a voltage below the threshold thereof at its input, and so be at a high voltage state at its output, such that the inverter comprising transistors 22 and 23 and the inverter comprising transistors 26 and 27 will each be in a high voltage state at the inputs thereof and in a low voltage state at the outputs thereof. With the inverter comprising transistors 26 and 27 in a low voltage state at its output, transistor 18 will be switched off and transistor 17 will be switched on.

Hence, a current will flow out of the drain of transistor 14 serving as a current source and through transistor 17 to begin charging capacitances 19 and 25. This current equals the current flowing out of the drain of transistor 10 and through resistor 12 and so is equal to:

$$I = \frac{V_{S\text{-}11} - V_{T\text{-}10} - (V_{GS\text{-}10} - V_{T\text{-}10})}{R_{R\text{-}12}},$$

where
- $I \triangleq$ current in transistors 10, 13, and 15,
- $V_{S\text{-}11} \triangleq$ voltage on point 11,
- $V_{T\text{-}10} \triangleq$ threshold voltage of transistor 10,
- $V_{GS\text{-}10} \triangleq$ voltage appearing between the gate and source of transistor 10,
- $R_{R\text{-}12} \triangleq$ resistance value of resistance 12.

The charging of capacitance 19 by the substantially constant current supplied through transistors 14 and 17 will yield a linear increase in voltage across capacitances 19 and 25.

Figure 2:
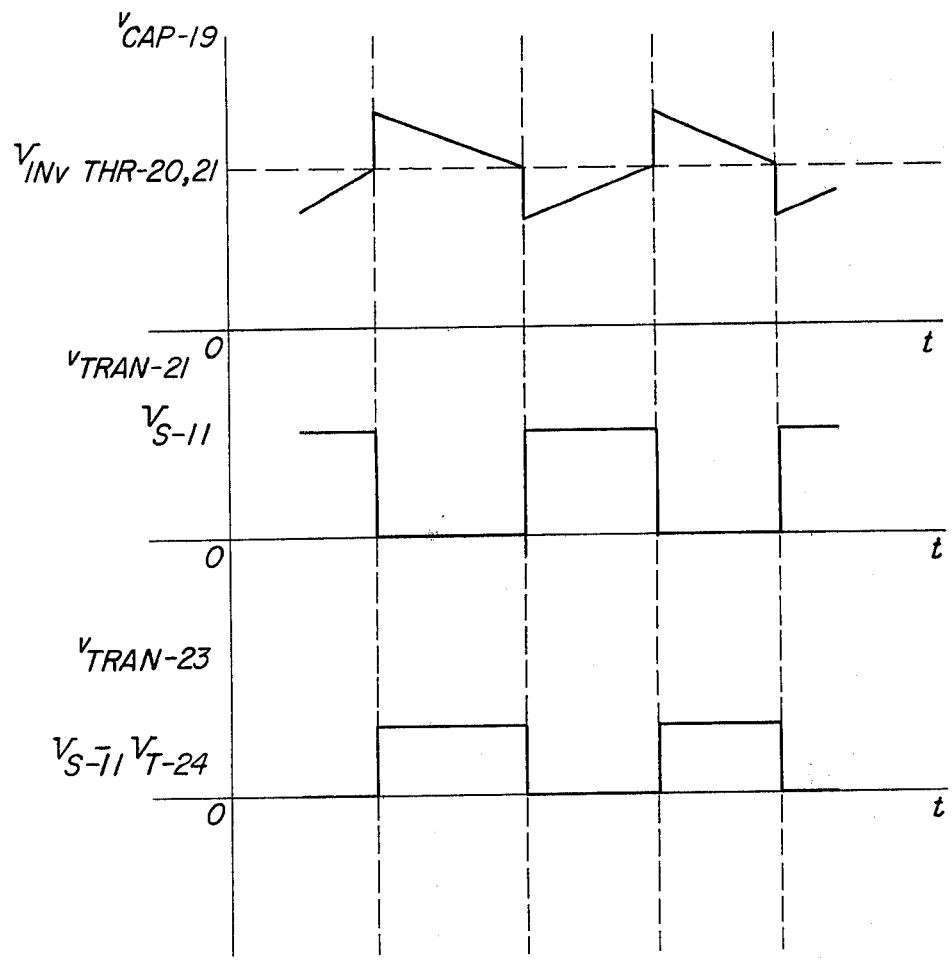
FIG. 2 shows graphs of signals occurring during operation of the present invention.

Turning to FIG. 2, three graphs are shown of voltages occurring at different points in the circuit of FIG. 1. The upper graph shows the voltage occurring across capacitance 19 designated $v_{CAP\text{-}19}$. The increase in voltage across capacitance 19 can be seen occurring at the lefthand side of the graph. The high voltage state of the output of the inverter comprising transistors 20 and 21 can be seen at the left of the middle graph of FIG. 2 showing the voltage between the drain and source of transistor 21, $v_{TRAN\text{-}21}$. The low voltage state at the output of the inverter comprising transistors 22 and 23 can be seen at the left of the lower graph on FIG. 2 showing the drain to source voltage of transistor 23, $v_{TRAN\text{-}23}$.

The state of the circuit remains unaltered until the voltage across capacitance 19 equals the threshold voltage of the inverter comprising transistors 20 and 21, a voltage which will be somewhere typically between 40 and 60 percent of the voltage appearing between point 11 and ground. When the voltage on capacitance 19 exceeds the threshold of the inverter comprising transistors 20 and 21, the inverter will shift state so that its output will be in the low voltage state. Since the voltage of this first inverter in the low voltage state is below the thresholds of the inverter comprising transistors 22 and 23 and the inverter comprising transistors 26 and 27, these latter two inverters will shift their outputs to the high state. This can be seen in the middle and lower graphs shown in FIG. 2. The middle graph shows the initial high voltage state of the inverter comprising transistors 20 and 21 followed by the shift to the low voltage state. The lowest graph in FIG. 2 shows the initial low state voltage of the inverter comprising transistors 22 and 23 followed by the shift to the high voltage state. The graph of the output of the voltage of the inverter comprising transistors 26 and 27 will be similar to that shown in the third graph of FIG. 2 but with a somewhat increased amplitude as there is no transistor similar to transistor 24 connected to the source of transistor 26.

Returning to the first graph in FIG. 2, the shifting of the output of the inverter comprising transistors 22 and 23 to the high voltage state causes a voltage equal to the voltage appearing on point 11, designated $v_{S\text{-}11}$, less approximately the threshold voltage of transistor 24 to be applied across capacitances 25 and 19. Since there will be a very low impedance through the channel regions of transistors 24 and 22, this voltage across capacitances 25 and 19 will very quickly charge the series connection of these two capacitances to be equal to this voltage applied thereacross. Because of the capacitive voltage divider action, the voltage across capacitance 19 nearly immediately after the inverter output state shift will be as follows:

$$v_{CAP\text{-}19} = V_{INV\ THR\text{-}20,21} + \frac{C_{C\text{-}25}}{C_{C\text{-}19} + C_{C\text{-}25}} (V_{S\text{-}11} - V_{T\text{-}10}),$$

where the previously used symbols have the same meaning as before and
- $v_{CAP\text{-}19} \triangleq$ voltage across capacitance 19,
- $V_{INV\ THR\text{-}20,21} \triangleq$ threshold voltage of inverter comprising transistors 20 and 21,
- $C_{C\text{-}19} \triangleq$ capacitance value of capacitance 19,
- $C_{C\text{-}25} \triangleq$ capacitance value of capacitance 25.

The voltage at the junction of capacitances 19 and 25, a voltage internal to the circuit of FIG. 1, is the one which could have values that are outside the range of values defined by the voltage appearing between point 11 and ground. However, a virtue of the circuit of FIG. 1 is the range of this internal voltage can be controlled by proper choices of capacitance values for capacitances 19 and 25 as the fraction in the last term of the immediately preceding equation depends only on these capacitances and controls the value of this term. This last term must have a value less than $V_{S\text{-}11}$-$V_{INV\ THR\text{-}20,21}$.

The voltage on capacitance 19 immediately begins discharging from this value because the shifting of the output of the inverter comprising transistors 26 and 27 to a high voltage state switches on transistor 18 and switches off transistor 17. The result is that current can no longer flow out of the drain of transistor 14 to charge capacitance 19, but rather capacitance 19 discharges through current being drawn through switch transistor 18 and the drain of transistor 16 serving as a current sink. Again, nothing happens to change the state of the circuit until the voltage of capacitance 19 drops below the threshold voltage $V_{INV\ THR\text{-}20,21}$ of the inverter comprising transistors 20 and 21.

At this point, the output of the inverter comprising transistors 20 and 21 shifts again to the high voltage state and the output of the inverter comprising transistors 22 and 23 and the inverter comprising transistors 26 and 27 both drop to a low voltage state. As a result, because of capacitive voltage divider action the voltage across capacitance 19 suddenly shifts to equal $$V_{CAP\text{-}19} = V_{INV\ THR\text{-}20,21} - \frac{C_{C\text{-}25}}{C_{C\text{-}19} + C_{C\text{-}25}}(V_{S\text{-}11} - V_{T\text{-}10}),$$

where the previously used symbols have the same meaning as before. The last term in this equation must have a value less than $V_{INV\ THR\text{-}20,21}$ if the voltage on capacitance 19 is not to go below ground. Also at this point, transistor 18 will be switched off while transistor 17 will be switched on and the current can flow out of the drain of transistor 14 and begin recharging capacitances 19 and 25.

This cycling then continues indefinitely as long as power is applied between point 11 and ground. The circuit of FIG. 1 provides two complementary outputs, 28 and 29, from which opposite phase rectangular voltage waves are available as the oscillation circuit output signals.

Thus, one can see that the period of oscillation for the circuit of FIG. 1 includes the time span of two of the successive triangular waveforms shown in the first graph in FIG. 2. This time span is determined by the rate of charging and discharging capacitances 19 and 25 by currents of values determined by transistor 10 and resistor 12. This period has been found to be as follows:

$$T = 2R_{R\text{-}12}\,C_{C\text{-}25}\frac{V_{S\text{-}11} - V_{T\text{-}24}}{V_{S\text{-}11} - V_{T\text{-}10} - (V_{GS\text{-}10} - V_{T\text{-}10})},$$

where the previously used symbols have the same meaning as before and

T $\triangleq$ period of circuit voltage oscillation.

One can see immediately from this equation that changing the resistance value of resistance 12 will alter the period of the circuit voltage oscillation as will changing the capacitance value of capacitance 25.

In practical implementation, however, the capacitance values achieved when constructing the capacitances of the circuit of FIG. 1 in a monolithic integrated circuit are relatively difficult to change. Therefore, to set the period of the circuit in FIG. 1, the resistance value of resistance 12 is typically adjusted by precise methods if the period of duration is important, i.e. if the circuit frequency of oscillation is important. If this period is important, resistance 12 can be made in thin film or thick film form located some place other than on the monolithic integrated circuit chip, or it could be a thin film resistance fabricated on the monolithic integrated circuit chip. In either case, resistance trimming methods can be used to precisely adjust the oscillator frequency.

If such precision in the period of the circuit oscillation is not required, resistance 12 can be fabricated by the usual methods in the monolithic integrated circuit chip. Alternatively, a n-channel MOSFET, 30, shown in long dash lines could be substituted for resistance 12 in the connection shown in FIG. 1 with the gate and drain of this transistor connected together to the drain of transistor 10, and with the source of transistor 30 grounded. That is, transistor 30 would be substituted for resistance 12 in the circuit of FIG. 1 to avoid having to fabricate resistance 12 which could take a substantial amount of scarce space in a monolithic integrated circuit chip.

A further alternative is shown in FIG. 1 by the use of another n-channel MOSFET, 31, in the connection shown as opposed to using transistor 30 in substitution for resistance 12. In this instance, the drain of transistor 31 is again connected to the drain of transistor 10 and the source of transistor 31 is grounded. However, the gate of transistor 31 is provided accessible to the user of the chip so that a voltage can be applied between this gate and ground to control the effective impedance appearing between the drain and source of transistor 31. That is, the period of oscillation of the circuit of FIG. 1, i.e. the circuit oscillation frequency, could be varied by varying the voltage applied between the gate and source of transistor 31.

The relationship between the voltage applied to the gate of transistor 31 and the oscillation frequency can be made more linear by providing a resistance between the source of transistor 31 and ground. In this arrangement, the p-type conductivity well in which transistor 31 is fabricated will not be connected to the most negative voltage in the circuit, but rather left to "float."

The circuit of FIG. 1 shows using a "current mirror" circuit based on a single reference current that leads to the same approximately instant magnitude current both charging and discharging capacitance 19. Separate and different reference currents in a "current mirror" circuit or other kinds of current sources providing different current waveforms could alternatively be used to charge, discharge or both charge and discharge capacitance 19. These alternatives could be used to alter the duty cycle of the waveforms in FIG. 2, etc.

Returning to the last equation set out above, the purpose can be seen in providing transistor 24 to remove a portion of the voltage applied across the inverter comprising transistors 22 and 23. The terms to the left of the terms in the parentheses in the denominator of this equation can usually be made large with respect to the value of the terms in the parentheses. The numerator and the denominator can come very close to cancelling one another since the threshold of two p-channel MOSFETs will very nearly be identical when they are fabricated in the same monolithic integrated circuit chip by the same process. Thus, the period of oscillation can be made to depend on essentially just the impedance appearing in the drain of transistor 10 and the value of the capacitance 25. To have the terms to the left of the terms in the parentheses in the denominator in the last equation be large with respect to the terms in the parentheses, transistor 10 can be fabricated to have a large channel width-to-channel length ratio and, of course, supply voltage $V_{S\text{-}11}$ can alternatively, or also, be made relatively large.

In some applications with oscillator circuits, however, stability of the oscillation period is not particularly important. In these circumstances, the circuit of FIG. 1 can be simplified by not using transistor 24. Thus, a short dashed line, 32, has been shown about transistor 24 as a connection to be used in place thereof. Further, eliminating transistor 24 will provide full supply voltage across the inverter comprising transistors 22 and 23 making possible the elimination of the inverter comprising transistors 26 and 27. This is shown by making a further connection represented by another short dashed line, 33, drawn from the output of the inverter comprising transistors 22 and 23 to the gates of transistors 17 and 18.

The embodiments of the invention in which an exclusive property or right is claimed are defined as follows:

1. An electronic oscillation circuit capable of providing a periodically varying output signal, said circuit providing:

a threshold capacitance having first and second plate regions;

a switchable current control means having a primary control input region and an output region, said switchable current control means being capable of providing a first selected current through said switchable current control means output region if a signal having substantially a first value is provided to said switchable current control means primary control input region, and being capable of drawing a second selected current through said switchable current control means output region if a signal having substantially a second value is provided to said switchable current control means primary control input region, said switchable current control means output region being electrically connected to said threshold capacitance first plate region with said threshold capacitance second plate region being electrically connected in said circuit to permit to at least some extent passing currents occurring at said switchable current control means output region through said threshold capacitance, said switchable current control means being also electrically connected to a first interconnection means adapted for electrical connection to a first electrical power supply means;

a threshold switch having an input region and an output means, said threshold switch being capable of providing an output voltage of substantially a selected first value at said threshold switch output means if a voltage signal having a value less than a selected first threshold value is provided at said threshold switch input region, and being capable of providing an output voltage of substantially a selected second value at said threshold switch output means if a voltage signal having a value exceeding said first selected threshold value is provided at said threshold switch input region, said selected second voltage value exceeding said selected first voltage value, said threshold switch input region being electrically connected to said threshold capacitance first plate region, said threshold switch output means being electrically connected to said switchable current control means primary control input region, said threshold switch being also electrically connected to a second interconnection means adapted for electrical connection to a second electrical power supply means; and a coupling capacitance having first and second plate regions, said coupling capacitance means first plate region being electrically connected to said threshold switch output means and said coupling capacitance means second plate region being electrically connected to said threshold capacitance first plate region.

2. The apparatus of claim 1 wherein said threshold switch comprises:

a threshold inversion means having an input region and an output region, said threshold inversion means input region being electrically in common with said threshold switch input region, said threshold inversion means being capable of providing an output signal having substantially a selected first value at said threshold inversion means output region if a voltage signal having a value greater than said first selected threshold value is provided at said threshold inversion means input region, and being capable of providing an output signal having a second value greater that said first value at said threshold inversion means output region if a voltage signal having a value less than said selected first threshold value is provided at said threshold inversion means input region; and a first output inverter means, serving at least as part of said threshold switch output means, and having an input region and an output region, said first output inverter means being capable of providing an output voltage of substantially said selected first voltage value at said first output inverter means output region if a signal having a value exceeding a selected second threshold value is provided at said first output inverter means input region, and being capable of providing an output voltage of substantially said selected second voltage value at said first output inverter means output region if a signal having a value less than said selected second threshold value is provided at said first output inverter means input region, said first output inverter means input region being electrically connected to said threshold inversion means output region.

3. The apparatus of claim 1 wherein said switchable current control means comprises:

a current sourcing means having an output region, said current sourcing means being capable of providing said first selected current to flow through said current sourcing means output region;

a current source switching means having first and second terminating regions and having a control region therein by which said current source switching means is capable of being directed to effectively provide a conductive path of a selected conductivity between said current source switching means first and second terminating regions, said current source switching means first terminating region being electrically connected to said current sourcing means output region, said current source switching means control region being electrically in common with said switchable current control means primary control input region, said current source switching means second terminating region being electrically in common with said switchable current control means output region;

a current sinking means having an output region, said current sinking means being capable of drawing said second selected current to flow through said current sinking means output region; and a current sink switching means having first and second terminating regions and having a control region therein by which said current sink switching means is capable of being directed to effectively provide a conductive path of a selected conductivity between said current sink switching means first and second terminating regions, said current sink switching means first terminating region being electrically in common with said switchable current control means output region, said current sink switching means control region being electrically in common with said switchable current control means primary control input region, and said current sink switching means second terminating region being electrically in common with said current sinking means output region.

4. The apparatus of claim 2 wherein said threshold switch output means further comprises a second output inverter means having an input region and an output region, said second output inverter means being capable of providing an output signal of substantially a selected first value at said second inverter means output region if a signal having a value exceeding of a selected third threshold value is provided at said second output inverter means input region, and being capable of providing an output signal having a second value greater than said first value at said second output inverter means output region if a signal having a value less than said selected third threshold value is provided at said second output inverter means input region, said second output inverter means input region being electrically connected to said threshold inversion means output region, and said second output inverter means output region being electrically in common with said switchable current control means primary control input region.

5. The apparatus of claim 2 wherein said switchable current control means comprises:
  a current sourcing means having an output region, said current sourcing means being capable of providing said first selected current to flow through said current sourcing means output region;
  a current source switching means having first and second terminating regions and having a control region therein by which said current source switching means is capable of being directed to effectively provide a conductive path of a selected conductivity between said current source switching means first and second terminating regions, said current source switching means first terminating region being electrically connected to said current sourcing means output region, said current source switching means control region being electrically in common with said switchable current control means primary control input region, said current source switching means second terminating region being electrically in common with said switchable current control means output region;
  a current sinking means having an output region, said current sinking means being capable of drawing said second selected current to flow through said current sinking means output region; and
  a current sink switching means having first and second terminating regions and having a control region therein by which said current sink switching means is capable of being directed to effectively provide a conductive path of a selected conductivity between said current sink switching means first and second terminating regions, said current sink switching means first terminating region being electrically in common with said switchable current control means output region, said current sink switching means control region being electrically in common with said switchable current control means primary control input region, and said current sink switching means second terminating region being electrically in common with said current sinking means output region.

6. The apparatus of claim 2 wherein said first output inverter means comprises a complementary metal-oxide-semiconductor field-effect transistor pair with transistor members of this pair having channel regions thereof being of opposite conductivity type and having these channel regions, as accessed through drain and source regions thereof, electrically connected in series with one another, and with transistor members of this pair having gate regions thereof electrically connected in common.

7. The apparatus of claim 3 wherein said current sourcing means and said current sinking means are each "current mirror" circuits with that current being "mirrored" in each of these circuits being selectively adjustable.

8. The apparatus of claim 4 wherein said second output inverter means comprises a complementary metal-oxide-semiconductor field-effect transistor pair with transistor members of this pair having channel regions thereof being of opposite conductivity type and having these channel regions, as accessed through source and drain regions thereof, electrically connected in series with one another, and with transistor members of this pair having gate regions thereof electrically connected in common.

9. The apparatus of claim 5 wherein said current sourcing means and said current sinking means are each "current mirror" circuits with that current being "mirrored" in each of these circuits being selectively adjustable.

10. The apparatus of claim 5 wherein said first output inverter means comprises a complimentary metal-oxide-semiconductor field-effect transistor pair with transistor members of this pair having channel regions thereof being of opposite conductivity type and having these channel regions, as accessed through source and drain regions thereof, electrically connected in series with one another, and with transistor members of this pair having gate regions thereof electrically connected in common.

11. The apparatus of claim 6 wherein there is an additional metal-oxide-semiconductor field-effect transistor having a channel region thereof, as accessed through source and drain regions thereof, electrically connected to said channel region of one of said transistor members of said pair.

12. The apparatus of claim 6 wherein said threshold inversion means comprises a complementary metal-oxide-semiconductor field-effect transistor pair with transistor members of this pair having channel regions thereof being of opposite conductivity type and having these channel regions, as accessed through source and drain regions thereof, electrically connected in series with one another, and with transistor members of this pair having gate regions thereof electrically connected in common.

13. The apparatus of claim 7 wherein said current source switching means and said current sink switching means comprise a complementary metal-oxide-semiconductor field-effect transistor pair with transistor members of this pair having channel regions thereof being of opposite conductivity type and having these channel regions, as accessed through source and drain regions thereof, electrically connected in a series with one another, and with transistor members of this pair having gate regions electrically connected in common, there being one member of this pair in said current source switching means with that other member remaining being in said current sink switching means; and and wherein said current sourcing means and said current sinking means "current mirror" circuits together comprise a current determination metal-oxide-semiconductor field-effect transistor having a drain region thereof electrically connected to a gate region thereof and to an impedance means, this current determination transistor gate region being also electrically connected to gate regions of first, second, third and fourth current mirror metal-oxide-semiconductor field-effect transistors with said first current mirror metal-oxide-semiconductor field-effect transistor being in said current sourcing means and with said second, third and fourth current mirror metal-oxide-semiconductor field-effect transistors being in said current sinking means with a drain region of said second current mirror metal-oxide-semiconductor field-effect transistor being electrically connected both to a drain region and a gate region of said third current mirror metal-oxide-semiconductor field-effect transistor and to a gate region of said fourth current mirror metal-oxide-semiconductor field-effect transistor, said third and fourth current mirror metal-oxide-semiconductor field-effect transistors being complementary transistors each having channel regions of an opposite conductivity type to that of said current determination transistor channel region.

14. The apparatus of claim 11 wherein said additional transistor is a p-channel transistor and is electrically connected to that one of said transistor members of said pair which is a p-channel transistor.

* * * * *